United States Patent
Li et al.

(10) Patent No.: US 9,555,718 B2
(45) Date of Patent: Jan. 31, 2017

(54) ESTIMATION AND COMPENSATION OF BATTERY MEASUREMENT AND ASYNCHRONIZATION BIASES

(71) Applicant: Ford Global Technologies, LLC, Dearborn, MI (US)

(72) Inventors: Yonghua Li, Ann Arbor, MI (US); Richard Dyche Anderson, Plymouth, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 326 days.

(21) Appl. No.: 14/099,056

(22) Filed: Dec. 6, 2013

(65) Prior Publication Data

US 2015/0158395 A1    Jun. 11, 2015

(51) Int. Cl.
*B60L 11/18* (2006.01)
*B60W 10/26* (2006.01)

(52) U.S. Cl.
CPC .......... *B60L 11/1861* (2013.01); *B60W 10/26* (2013.01); *B60W 2510/244* (2013.01); *B60W 2710/248* (2013.01); *Y02T 10/7005* (2013.01)

(58) Field of Classification Search
None
See application file for complete search history.

(56) References Cited

U.S. PATENT DOCUMENTS

| | | |
|---|---|---|
| 3,895,284 A | 7/1975 | Schweizer et al. |
| 6,441,586 B1 | 8/2002 | Tate, Jr. et al. |
| 6,534,954 B1 | 3/2003 | Plett |
| 7,233,128 B2 | 6/2007 | Brost et al. |
| 7,315,789 B2 | 1/2008 | Plett |
| 7,649,338 B2 | 1/2010 | Sen et al. |
| 8,004,243 B2 | 8/2011 | Paryani et al. |
| 8,803,528 B2 * | 8/2014 | Kim .................. G01R 19/2506 320/158 |
| 9,130,248 B2 * | 9/2015 | Laskowsky ........ G01R 31/3675 |
| 9,440,552 B2 * | 9/2016 | Li ...................... B60L 11/1861 |

(Continued)

OTHER PUBLICATIONS

Verbrugge, Mark and Koch, Brian, Generalized Recursive Algorithm for Adaptive Multiparameter Regression, Application to Lead Acid, Nickel Metal Hydride, and Lithium-Ion Batteries, Journal of the Electrochemical Society, 153(1) A187-A201 (2006).

(Continued)

*Primary Examiner* — Redhwan K Mawari
*Assistant Examiner* — Edward Torchinsky
(74) *Attorney, Agent, or Firm* — David B. Kelley; Brooks Kushman P.C.

(57) ABSTRACT

A hybrid or electric vehicle includes a traction battery to store and provide energy for the vehicle. The traction battery includes a number of battery cells. For effective operation of the traction battery, operating parameters, such as state of charge and battery power limits, may need to be known. The operating parameters may be a function of battery cell voltage and impedance parameters. A parameter estimation scheme may use measured cell voltages and a measured traction battery current as inputs. A current measurement bias may be modeled that incorporates measurement bias caused by asynchronous current and voltage measurements. The current measurement bias may be estimated for each cell and the value may differ between cells.

7 Claims, 3 Drawing Sheets

(56) References Cited

U.S. PATENT DOCUMENTS

| | | | |
|---|---|---|---|
| 2010/0055543 A1* | 3/2010 | Tae | B60L 11/1803 429/50 |
| 2010/0153038 A1* | 6/2010 | Tomura | G01R 31/3624 702/63 |
| 2012/0179435 A1 | 7/2012 | Song et al. | |
| 2015/0153417 A1* | 6/2015 | Maluf | B60L 11/1861 324/426 |
| 2015/0251555 A1* | 9/2015 | Li | B60L 11/1861 701/22 |
| 2015/0352972 A1* | 12/2015 | Li | G01R 31/3648 701/22 |

OTHER PUBLICATIONS

Journal of the Electrochemical Society, Generalized Recursive Algorithm for Adaptive Multiparameter Regression Application to Lead Acid, Nickel Metal Hydridge, and Lithium-Ion Batteries, vol. 153, Issue 1, A187-A201, 2006.

Plett, Gregory L., Efficient Battery Pack State Estimation using Bar-Delta Filtering, EVS24, Stavanger, Norway, May 13-16, 2009, University of Colorado at Colorado Springs and Consultant to Compact Power Inc.

Rui Xiong, et al., Energies ISSN 1996-1073, Online Estimation of Peak Power Capability of Li-Ion Batteries in Electric Vehicles by a Hardware-in-Loop Approach, Energies 2012, 5, 1455-1469, www.mdp.com/journal/energies, Published May 15, 2012.

Xiaosong Hu, et al., Energies ISSN 1996-1073, Estimation of State Charge of a Lithium-Ion Battery Pack for Electric Vehicles Using an Adaptive Luenberger Observer, Published Sep. 9, 2010.

\* cited by examiner

ESTIMATION AND COMPENSATION OF BATTERY MEASUREMENT AND ASYNCHRONIZATION BIASES

TECHNICAL FIELD

This application generally relates to calculating battery state of charge and power capability.

BACKGROUND

Hybrid-electric and pure electric vehicles rely on a traction battery to provide power for propulsion. As the power stored in a traction battery is not endless, properties of the traction battery must be monitored to track the present capability of the traction battery. One important quantity is the battery power capability which indicates how much power the battery may supply or absorb at a given time. Another important quantity is the battery state of charge which indicates the amount of charge stored in the battery. There are many known schemes for estimating these quantities.

A traction battery system will generally measure voltages and currents associated with the traction battery. In an ideal world, the sensors used to measure these voltages and currents would provide accurate information. Unfortunately, the environment in an automobile may be an electrically noisy environment. The sensors generally experience some measurement biases. The battery pack is constructed of many battery cells. Physical battery properties, such as current, voltage and temperature, may be measured by different sensors at different sample rates. Asynchronization issues may arise as the sensors may be sampled sequentially and filtered differently. The biased signals are then used for calculations leading to inaccurate values. These inaccurate values and asynchronization phenomenon may lead to incorrect estimation of battery parameters.

Prior art techniques of compensating for measurement biases include measuring the sensors when no load is applied. The value measured during the no-load condition is then added or subtracted to the measured values during operation to yield a corrected sensor value. This approach requires that there be some predictable no-load operation intervals. For a traction battery system, the no-load measurement may be performed before closing a main contactor that connects the traction battery to an electrical load. This may cause delays in closing the main contactor and inaccurate measurement biases. This method also cannot compensate for changing biases during extended operation periods.

SUMMARY

A vehicle includes a traction battery including a plurality of cells and at least one controller. The controller is programmed to implement a state estimator configured to output, for each cell, voltage parameters based on a current measurement bias specific to the cell that depends on a temporal difference between current and voltage measurements for the cell. The controller is further programmed to operate the traction battery according to battery power limits defined by output of the state estimator, wherein at least some of the current measurement biases have different values. The voltage parameters may be further based on an error between a measured cell terminal voltage and an estimated cell terminal voltage. The at least one controller may be further programmed to operate the traction battery according to a battery state of charge defined by output of the state estimator. The voltage parameters may include an open circuit voltage for the cell. The state estimator may be further configured to output, for each cell, impedance parameters based on the current measurement bias specific to the cell. The impedance parameters may include a resistance associated with the cell. The current measurement bias may be based on measured cell terminal voltages and a measured traction battery current. The state estimator may be further configured to apply a forgetting factor to the current measurement bias.

A vehicle includes a traction battery including a plurality of cells and at least one controller. The controller is programmed to implement a state estimator configured to output, for each cell, voltage parameters based on a current measurement bias specific to the cell that depends on a temporal difference between current and voltage measurements for the cell. The controller is further programmed to operate the traction battery according to a state of charge defined by output of the state estimator. The at least one controller may be further programmed to control the traction battery according to battery power limits defined by output of the state estimator. At least some of the current measurement biases may have different values. The voltage parameters may include an open circuit voltage for the cell. The state estimator may be further configured to output, for each cell, impedance parameters based on the current measurement bias specific to the cell. The impedance parameters may include a resistance associated with the cell. The state estimator may be further configured to apply a forgetting factor to the current measurement bias.

A method for controlling a traction battery including a plurality of cells includes implementing, by at least one controller, a state estimator configured to output voltage parameters for each of the cells based on a current measurement bias specific to each of the cells that depends on a temporal difference between current and voltage measurement for each of the cells. The method further includes operating the traction battery according to battery power limits derived from the voltage parameters. The current measurement bias may be based on measured cell terminal voltages and a measured traction battery current.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
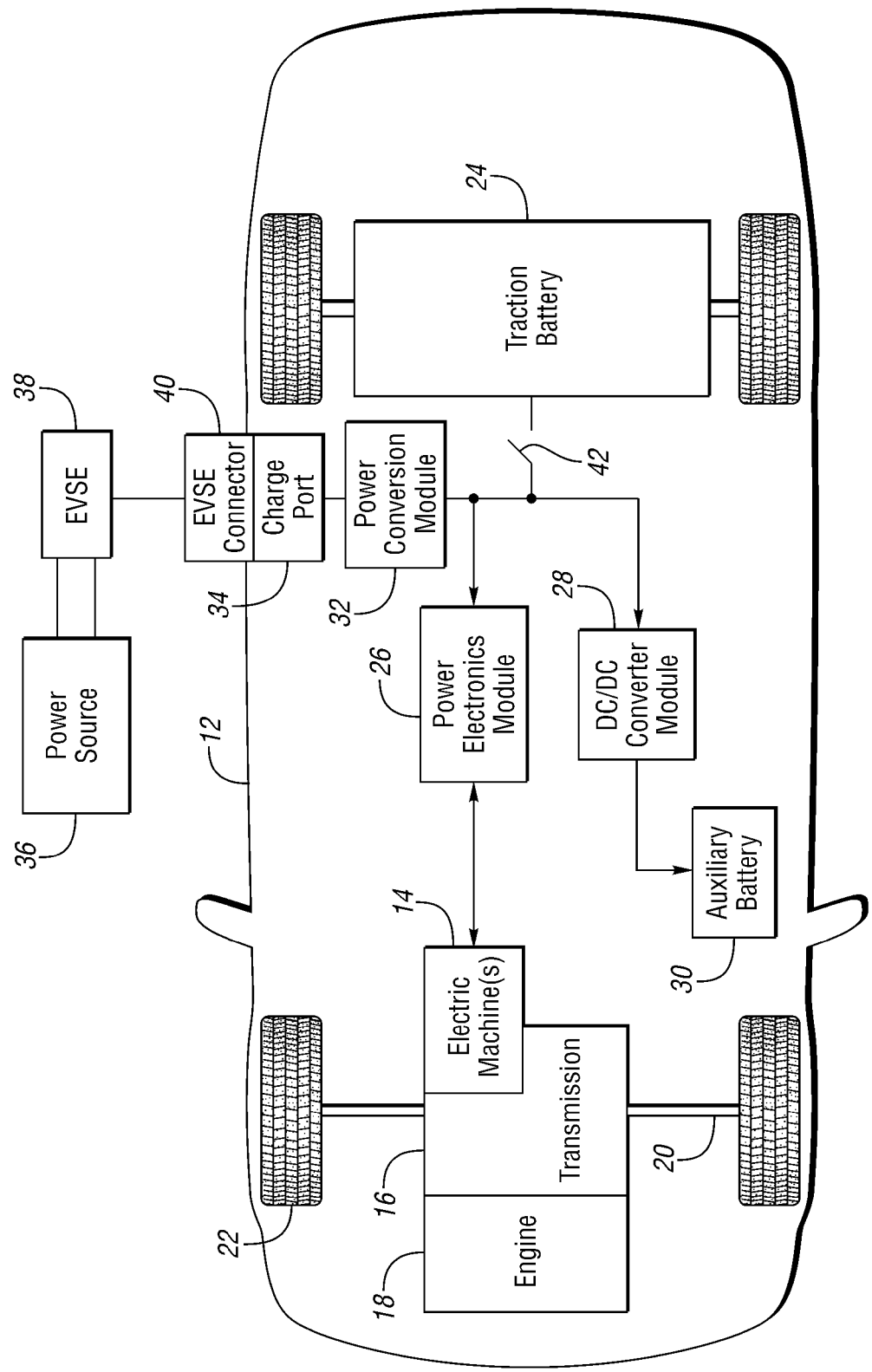
FIG. 1 is a diagram of a plug-in hybrid-electric vehicle illustrating typical drivetrain and energy storage components.

FIG. 1 depicts a typical plug-in hybrid-electric vehicle (HEV). A typical plug-in hybrid-electric vehicle 12 may comprise one or more electric machines 14 mechanically connected to a hybrid transmission 16. The electric machines 14 may be capable of operating as a motor or a generator. In addition, the hybrid transmission 16 is mechanically connected to an engine 18. The hybrid transmission 16 is also mechanically connected to a drive shaft 20 that is mechanically connected to the wheels 22. The electric machines 14 can provide propulsion and deceleration capability when the engine 18 is turned on or off. The electric machines 14 also act as generators and can provide fuel economy benefits by recovering energy that would normally be lost as heat in the friction braking system. The electric machines 14 may also provide reduced pollutant emissions since the hybrid-electric vehicle 12 may be operated in electric mode under certain conditions.

A traction battery or battery pack 24 stores energy that can be used by the electric machines 14. A vehicle battery pack 24 typically provides a high voltage DC output. The traction battery 24 may be electrically connected to one or more power electronics modules 26 through one or more contactors 42. The one or more contactors 42 isolate the traction battery 24 from other components when opened and connects the traction battery 24 to other components when closed. The power electronics module 26 is also electrically connected to the electric machines 14 and provides the ability to bi-directionally transfer energy between the traction battery 24 and the electric machines 14. For example, a typical traction battery 24 may provide a DC voltage while the electric machines 14 may require a three-phase AC current to function. The power electronics module 26 may convert the DC voltage to a three-phase AC current as required by the electric machines 14. In a regenerative mode, the power electronics module 26 may convert the three-phase AC current from the electric machines 14 acting as generators to the DC voltage required by the traction battery 24. The description herein is equally applicable to a pure electric vehicle. For a pure electric vehicle, the hybrid transmission 16 may be a gear box connected to an electric machine 14 and the engine 18 may not be present.

In addition to providing energy for propulsion, the traction battery 24 may provide energy for other vehicle electrical systems. A typical system may include a DC/DC converter module 28 that converts the high voltage DC output of the traction battery 24 to a low voltage DC supply that is compatible with other vehicle loads. Other high-voltage loads, such as compressors and electric heaters, may be connected directly to the high-voltage without the use of a DC/DC converter module 28. In a typical vehicle, the low-voltage systems are electrically connected to an auxiliary battery 30 (e.g., 12V battery).

The vehicle 12 may be an electric vehicle or a plug-in hybrid vehicle in which the traction battery 24 may be recharged by an external power source 36. The external power source 36 may be a connection to an electrical outlet. The external power source 36 may be electrically connected to electric vehicle supply equipment (EVSE) 38. The EVSE 38 may provide circuitry and controls to regulate and manage the transfer of energy between the power source 36 and the vehicle 12. The external power source 36 may provide DC or AC electric power to the EVSE 38. The EVSE 38 may have a charge connector 40 for plugging into a charge port 34 of the vehicle 12. The charge port 34 may be any type of port configured to transfer power from the EVSE 38 to the vehicle 12. The charge port 34 may be electrically connected to a charger or on-board power conversion module 32. The power conversion module 32 may condition the power supplied from the EVSE 38 to provide the proper voltage and current levels to the traction battery 24. The power conversion module 32 may interface with the EVSE 38 to coordinate the delivery of power to the vehicle 12. The EVSE connector 40 may have pins that mate with corresponding recesses of the charge port 34.

The various components discussed may have one or more associated controllers to control and monitor the operation of the components. The controllers may communicate via a serial bus (e.g., Controller Area Network (CAN)) or via discrete conductors.

Figure 2:
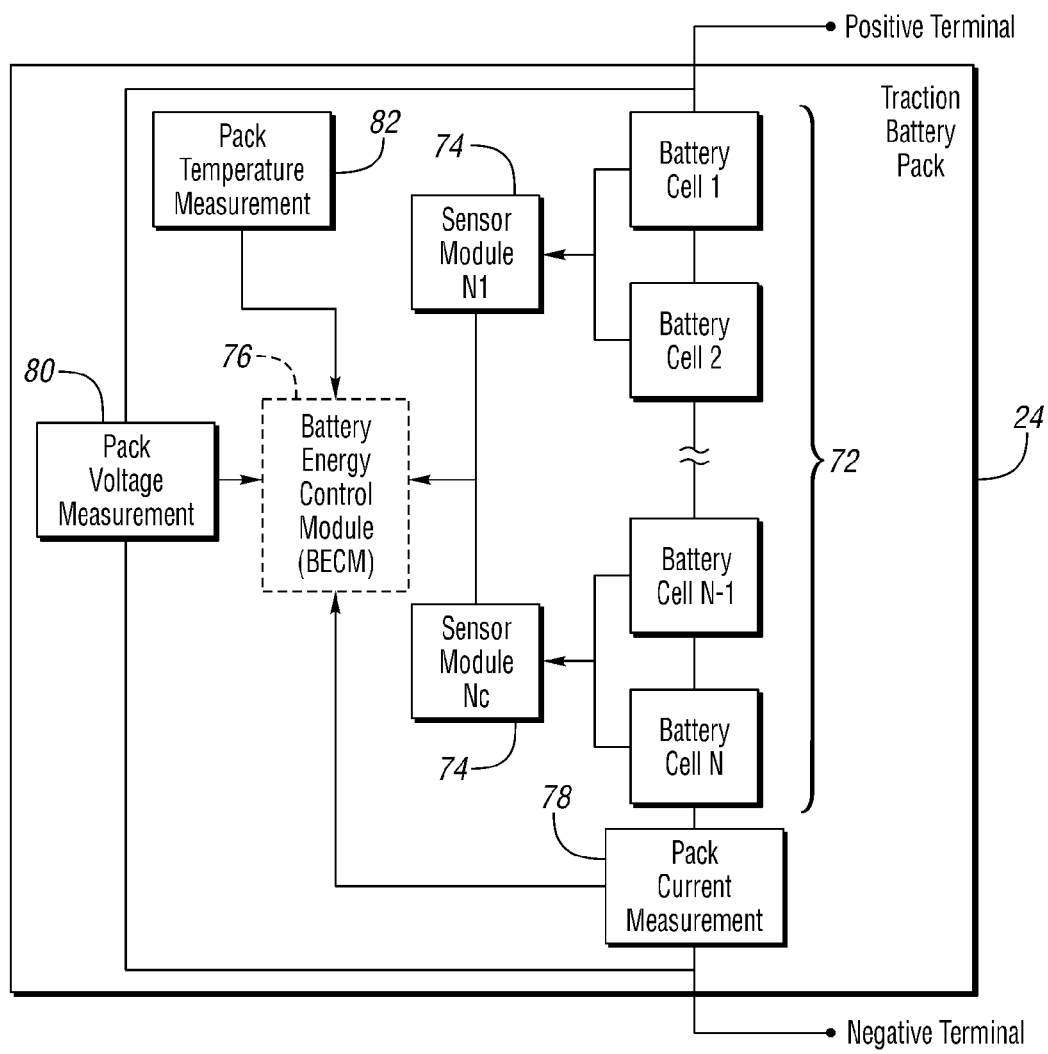
FIG. 2 is a diagram of a possible battery pack arrangement comprised of multiple cells, and monitored and controlled by a Battery Control Module.

A traction battery 24 may be constructed from a variety of chemical formulations. Typical battery pack chemistries are lead acid, nickel-metal hydride (NIMH) or Lithium-Ion. FIG. 2 shows a typical traction battery pack 24 in a simple series configuration of N battery cells 72. Other battery packs 24, however, may be composed of any number of individual battery cells connected in series or parallel or some combination thereof. A typical system may have a one or more controllers, such as a Battery Energy Control Module (BECM) 76 that monitors and controls the performance of the traction battery 24. The BECM 76 may monitor several battery pack level characteristics such as pack current 78, pack voltage 80 and pack temperature 82. The BECM 76 may have non-volatile memory such that data may be retained when the BECM 76 is in an off condition. Retained data may be available upon the next key cycle.

In addition to the pack level characteristics, there may be battery cell 72 level characteristics that are measured and monitored. For example, the terminal voltage, current, and temperature of each cell 72 may be measured. A system may use a sensor module 74 to measure the battery cell 72 characteristics. Depending on the capabilities, the sensor module 74 may measure the characteristics of one or multiple of the battery cells 72. The battery pack 24 may utilize up to $N_c$ sensor modules 74 to measure the characteristics of all the battery cells 72. Each sensor module 74 may transfer the measurements to the BECM 76 for further processing and coordination. The sensor module 74 may transfer signals in analog or digital form to the BECM 76. In some embodiments, the sensor module 74 functionality may be incorporated internally to the BECM 76. That is, the sensor module 74 hardware may be integrated as part of the circuitry in the BECM 76 and the BECM 76 may handle the processing of raw signals.

It may be useful to calculate various characteristics of the battery pack. Quantities such a battery power capability and battery state of charge may be useful for controlling the operation of the battery pack as well as any electrical loads receiving power from the battery pack. Battery power capability is a measure of the maximum amount of power the battery can provide or the maximum amount of power that the battery can receive. Knowing the battery power capability allows electrical loads to be managed such that the power requested is within limits that the battery can handle.

Battery pack state of charge (SOC) gives an indication of how much charge remains in the battery pack. The battery pack SOC may be output to inform the driver of how much charge remains in the battery pack, similar to a fuel gauge. The battery pack SOC may also be used to control the operation of an electric or hybrid-electric vehicle. Calculation of battery pack SOC can be accomplished by a variety of methods. One possible method of calculating battery SOC is to perform an integration of the battery pack current over time. This is well-known in the art as ampere-hour integration. One possible disadvantage to this method is that the current measurement may be noisy. Possible inaccuracy in the state of charge may occur due to the integration of this noisy signal over time.

The accuracy of voltage and current sensor measurement depend on many factors. Noise may impact the signal that is measured. For example, accuracy of a hall effect type current sensor may depend on shielding the sensor and conductors from environmental magnetic fields. Biases in the sensor measurements may also be present. Prior art systems may utilize current measurements taken prior to contactor closing to calculate a current measurement bias. Before the contactor closes, there should be no current flowing.

A battery management system may estimate various battery parameters based on the sensor measurements. Current and voltage sensor biases and inaccuracies may be time-varying in nature. Therefore, pre-contactor close compensation may not be accurate enough over the entire operating time of the sensors. The short sample time before the contactor is closed only allows limited sampling of the current sensor. The pre-contactor close samples may not be accurate due to the rise time of the current sensor from BECM start-up. Another significant issue may be the lack of exact synchronization in voltage and current measurements. Battery parameter identification depends on well-defined inputs (current) and outputs (terminal voltage). A loss of synchronization between the signals may result in measured data that does not accurately represent the real battery behavior which may lead to erroneous parameter estimation.

Figure 3:
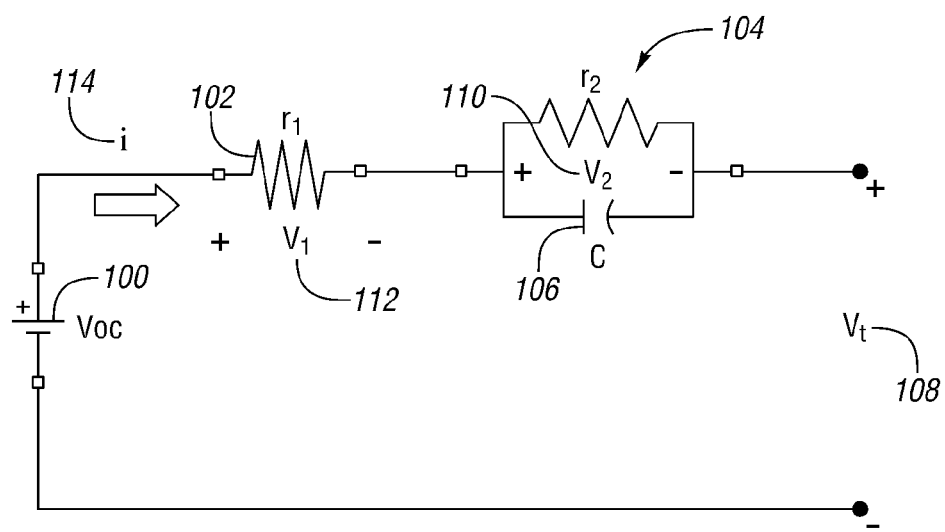
FIG. 3 is a diagram of an example battery cell equivalent circuit.

FIG. 3 shows one possible battery cell equivalent circuit model (ECM). A battery cell may be modeled as a voltage source ($V_{oc}$) 100 having associated resistances (102 and 104) and capacitance 106. Because of the battery cell impedance, the terminal voltage, $V_t$ 108, is typically not the same as the open-circuit voltage, $V_{oc}$ 100. The open-circuit voltage, $V_{oc}$ 100, is not readily measurable as only the terminal voltage 108 of the battery cell is accessible for measurement. Because the $V_{oc}$ 100 is not readily measurable, a model-based method may be used to estimate the value. A model may require that the values of resistances and capacitance be known or estimated. The battery cell model may depend on the battery chemistry. The precise model chosen for the battery cell is not necessarily critical to the methods described.

The ideal circuit model may be represented by state space equations in the continuous time domain as follows:

$$\dot{V}_{oc} = -\frac{df(soc)}{dsoc} * \frac{1}{Q} * i \quad (1)$$

$$\dot{V}_2 = -\frac{1}{r_2 C} V_2 + \frac{1}{C} * i \quad (2)$$

$$V_t = V_{oc} - V_2 - r_1 * i \quad (3)$$

In discrete time, the circuit model may be expressed as follows:

$$V_{oc}(k+1) = V_{oc}(k) - T_s * \frac{df(soc)}{dsoc} * \frac{1}{Q} * i(k) \quad (4)$$

$$V_2(k+1) = \left(1 - T_s * \frac{1}{r_2 C}\right) * V_2(k) + T_s * \frac{1}{C} * i(k) \quad (5)$$

$$V_t(k) = V_{oc}(k) - V_2(k) - r_1 * i(k) \quad (6)$$

Two uncertainty factors may be associated with the input current i(k). First, the current may be leading (or lagging) the voltage measurement by $k_a$ time steps. Second, the current may be biased toward a true current value by $I_b$ amperes. Incorporating these uncertainty factors into equations (4)-(6) gives the following expressions:

$$V_{oc}(k+1) = V_{oc}(k) - T_s * \frac{df(soc)}{dsoc} * \frac{1}{Q} * (i(k-k_a) + I_b) \quad (7)$$

$$V_2(k+1) = \left(1 - T_s * \frac{1}{r_2 C}\right) * V_2(k) + T_s * \frac{1}{C} * (i(k-k_a) + I_b) \quad (8)$$

$$V_t(k) = V_{oc}(k) - V_2 - r_1 * (i(k-k_a) + I_b) \quad (9)$$

The term $(i(k-k_a)+I_b)$ may represent the true or actual current. It may be desirable to express this term as a function of the measured current, i(k). The actual current may be expressed as $(i(k)+i_b(k))$. The term $i_b(k)$ is equal to $((i(k-k_a)+I_b-i(k)))$ and represents the total asynchronization and measurement bias between the actual current and the measured current. The asynchronization bias may represent the temporal difference between the traction battery current measurement and the cell terminal voltage measurement. Equations (7)-(9) may now be expressed as:

$$V_{oc}(k+1) = V_{oc}(k) - T_s * \frac{df(soc)}{dsoc} * \frac{1}{Q} * (i(k) + i_b(k)) \quad (10)$$

$$V_2(k+1) = \left(1 - T_s * \frac{1}{r_2 C}\right) * V_2(k) + T_s * \frac{1}{C} * (i(k) + i_b(k)) \quad (11)$$

$$V_t(k) = V_{oc}(k) - V_2 - r_1 * (i(k) + i_b(k)) \quad (12)$$

Equations (10)-(12) may form the basis of "projection" in an adaptive battery controls scheme. $V_{oc}$ represents the open circuit voltage (OCV). $V_t$ represents the cell terminal voltage. The term $i_b(k)$ is the delta current between the measured and the actual current.

Figure 4:
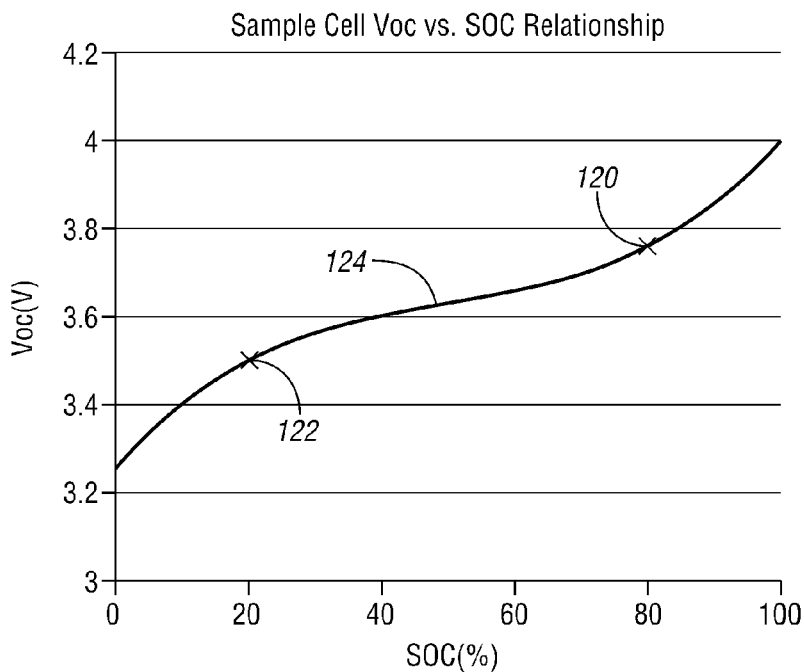
FIG. 4 is a graph that illustrates a possible open-circuit voltage (Voc) vs. battery state of charge (SOC) relationship for a typical battery cell.

For a typical Lithium-Ion battery cell, there is a relationship between SOC and the open-circuit voltage ($V_{oc}$) such that $V_{oc}$=f(SOC). FIG. 4 shows a typical curve 124 showing the open-circuit voltage $V_{oc}$ as a function of SOC. The relationship between SOC and $V_{oc}$ may be determined from an analysis of battery properties or from testing the battery cells. The function may be such that SOC may be calculated as $f^1(V_{oc})$. The function or the inverse function may be implemented as a table lookup or an equivalent equation. The exact shape of the curve 124 may vary based on the exact formulation of the Lithium-Ion battery. The voltage $V_{oc}$ changes as a result of charging and discharging of the battery. The term df(soc)/dsoc represents the slope of the curve 124.

A state estimator may be designed to estimate voltage and impedance parameters of the equivalent circuit model. Different sets of states and parameters for the battery model may be defined for use in an Extended Kalman Filter (EKF). The state vector may be defined as:

$$x = \begin{bmatrix} x_1 \\ x_2 \\ x_3 \\ x_4 \\ x_5 \\ x_6 \end{bmatrix} = \begin{bmatrix} V_{oc} \\ V_2 \\ 1/r_2 \\ 1/C \\ r_1 \\ i_b \end{bmatrix} \quad (13)$$

It may be assumed that the impedance parameters ($r_1$, $r_2$, and C) and the current sensor bias vary slowly over time. As such, their respective derivatives and noise inputs may be assumed to be zero. The voltage parameters, $V_{oc}$ and $V_2$, may be assumed to vary with time. If the output z is set to $z=V_{oc}-V_2-r_1*(i+i_b)$, the state space equation of the circuit with the state and parameters defined by equation (13) becomes:

$$\frac{dx}{dt} = \begin{bmatrix} dx_1(t)/dt \\ dx_2(t)/dt \\ dx_3(t)/dt \\ dx_4(t)/dt \\ dx_5(t)/dt \\ dx_6(t)/dt \end{bmatrix} = \begin{bmatrix} -\frac{df(soc)}{dsoc} * \frac{1}{Q} * (i+x_6) \\ -x_2 x_3 x_4 + x_4 i + x_4 x_6 \\ 0 \\ 0 \\ 0 \\ 0 \end{bmatrix} \quad (14)$$

$$z = x_1 - x_2 - x_5 x_6 - x_5 * i \quad (15)$$

Equations (14) and (15) may be discretized using Euler's method (i.e., $dx/dt=(x(k)-x(k-1))/T_s$), where $T_s$ is the sampling rate. Considering the process noise and measurements noise, the following equations result:

$$x_1(k) = x_1(k-1) - T_s \frac{df(soc)}{dsoc} \frac{1}{Q} x_6(k-1) - \quad (16)$$
$$T_s \frac{df(soc)}{dsoc} \frac{1}{Q} i(k-1) + w_1(k-1)$$

$$x_2(k) = (1 - T_s x_3(k-1)x_4(k-1))x_2(k-1) + \quad (17)$$
$$T_s x_4(k-1)x_6(k-1) + T_s x_4(k-1)i(k-1) + w_2(k-1)$$

$$x_3(k) = x_3(k-1) + w_3(k-1) \quad (18)$$

$$x_4(k) = x_4(k-1) + w_4(k-1) \quad (19)$$

$$x_5(k) = x_5(k-1) + w_5(k-1) \quad (20)$$

$$x_6(k) = x_6(k-1) + w_6(k-1) \quad (21)$$

$$z(k) = x_1(k) - x_2(k) - x_5(k)x_6(k) - x_5(k)i(k) + v(k) \quad (22)$$

where $w_i$ represents process and measurement noise for each state variable and v(k) represents a voltage sensor measurement noise.

The Jacobian matrices for the state and measurement may be derived as:

$$A = \frac{\partial f}{\partial x} = \begin{bmatrix} 1 & 0 & 0 & 0 & 0 & -T_s \frac{df(soc)}{dsoc} \frac{1}{Q} \\ 0 & 1 - T_s x_3(k-1)x_4(k-1) & -T_s x_2(k-1)x_4(k-1) & \begin{matrix} -T_s x_2(k-1)x_3(k-1)+ \\ T_s x_6(k-1) + T_s i(k-1) \end{matrix} & 0 & T_s x_4(k-1) \\ 0 & 0 & 1 & 0 & 0 & 0 \\ 0 & 0 & 0 & 1 & 0 & 0 \\ 0 & 0 & 0 & 0 & 1 & 0 \\ 0 & 0 & 0 & 0 & 0 & 1 \end{bmatrix} \quad (23)$$

$$W = \frac{\partial f}{\partial w} = \begin{bmatrix} 1 & 0 & 0 & 0 & 0 & 0 \\ 0 & 1 & 0 & 0 & 0 & 0 \\ 0 & 0 & 1 & 0 & 0 & 0 \\ 0 & 0 & 0 & 1 & 0 & 0 \\ 0 & 0 & 0 & 0 & 1 & 0 \\ 0 & 0 & 0 & 0 & 0 & 1 \end{bmatrix} \quad (24)$$

$$H = \frac{\partial h}{\partial x} = [1 \quad -1 \quad 0 \quad 0 \quad -i(k-1) - x_6(k-1) \quad -x_5(k-1)] \quad (25)$$

$$V = \frac{\partial h}{\partial v} = [1] \quad (26)$$

The complete set of EKF equations consists of time update equations and measurement update equations. The EKF may be used for systems having a state model represented by $x_k=f(x_{k-1}, u_{k-1})+w_{k-1}$ and output model represented by $z_k=h(x_k)+v_k$. The EKF time update equations project the state and covariance estimate from the previous time step to the current step:

$$\hat{x}_k^- = f(\hat{x}_{k-1}, u_{k-1}, 0) \tag{27}$$

$$P_k^- = A_k P_{k-1} A_k^T + W_k Q_{k-1} W_k^T \tag{28}$$

where: $\hat{x}_k^-$ represents a priori estimate of $x_k$; $P_k^-$ represents a priori estimate error covariance matrix; $A_k$ represents the Jacobian matrix of the partial derivatives of function f(X, u, w) with respect to X; $P_{k-1}$ represents a posteriori estimate error matrix of last step; $A_k^T$ represents transpose of matrix $A_k$; $W_k$ represents the Jacobian matrix of the partial derivatives of function f(X, u, w) with respect to process noise variable w; $Q_{k-1}$ represents a process noise covariance matrix, and $W_k^T$ represents transpose of matrix $W_k$.

The measurement update equations correct the state and covariance estimate with the measurement:

$$K_k = P_k^- H_k^T (H_k P_k^- H_k^T + V_k R_k V_k^T)^{-1} \tag{29}$$

$$\hat{x}_k = \hat{x}_k^- + K_k(z_k - h(\hat{x}_k^-, 0)) \tag{30}$$

$$P_k = (I - K_k H_k) P_k^- \tag{31}$$

where: $K_k$ represents the EKF gain; $H_k$ represents the Jacobian matrix of the partial derivatives of h with respect to X; $H_k^T$, is the transpose of $H_k$; $R_k$ represents a measurement noise covariance matrix; $V_k$ represents the Jacobian matrix of the partial derivatives of h with respect to measurement noise variable v; $z_k$ represents the measured output values; and $V_k^T$ is the transpose of $V_k$.

Figure 5:
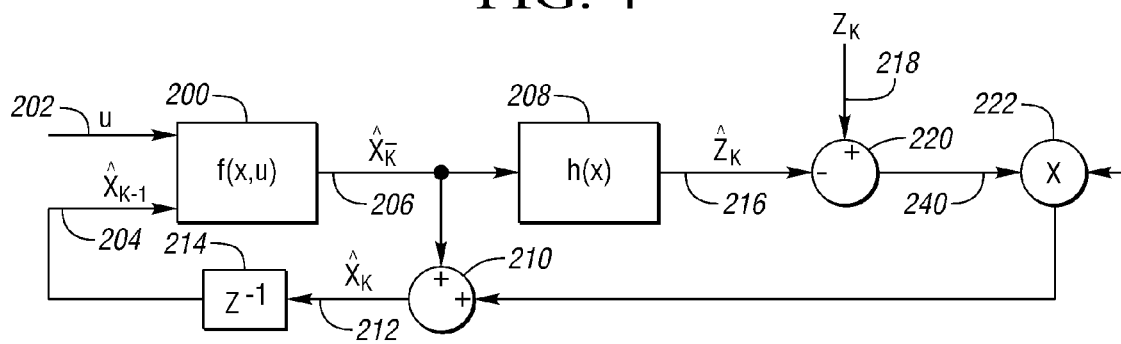
FIG. 5 is a diagram illustrating an Extended Kalman Filter.
Figure 5:
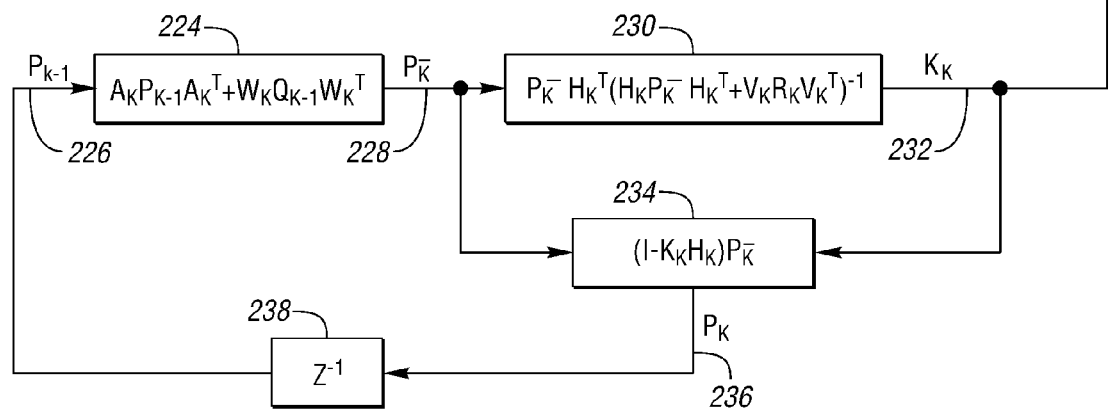

The above equations are depicted in FIG. 5. An input u 202 and a previous state estimate $\hat{x}_{k-1}$ 204 may be fed through the system dynamic model, f(x, u) 200. The function f(x, u) 200 may be represented, for example, by equations (16) through (21). The output may be a preliminary state estimate $\hat{x}_k^-$ 206 for the current time period. The preliminary state estimate 206 may be fed through the output model, h(x) 208 to achieve an estimate of the output variable 216. The output variable 216 in the above example is an estimate of the battery cell terminal voltage. The model h(x) 208 may be represented, for example, by equation (22). The model output 216 may be subtracted 220 from a measured value 218 to generate a measurement error 240. The measured value 218 in this example may be the measured battery cell terminal voltage. The measurement error 240 may then be multiplied 222 by a gain factor $K_k$ 232.

An a priori error covariance matrix $P_k^-$ 228 may be calculated according to equation (28) 224. The a priori error covariance matrix 228 may then be used to calculate the EKF gain factor 232 according to equation (29) 230. An a posteriori error covariance matrix $P_k$ 236 may then be calculated according to equation (31) 234.

Once the EKF gain factor 232 is calculated, the final state estimate 212 may be calculated by summing 210 the preliminary state estimate 206 and the product 222 of the measurement error 240 and the EKF gain 232. In preparation for the next execution cycle, the value of the state estimate 212 may be stored in controller memory. During the next execution cycle, the state estimate 212 may be available as the previous state estimate 204 which may be represented by a delay element 214. Similarly, the a posteriori error covariance matrix 236 may be saved for use during the next execution cycle which is represented by a delay element 238.

The above EKF may be performed for each cell of the battery pack, such that an equivalent circuit current measurement bias incorporating both sensor measurement bias and asynchronization between current and voltage sensor measurements is estimated for each cell of the traction battery. The above strategy allows that at least some of the cells may have different current measurement bias values. An advantage of this approach may be that the estimated bias current accounts for synchronization issues between the voltage and current measurements. In a practical implementation, there may be delays between voltage and current measurements due to sampling and measuring the values, and execution order of related filtering tasks in the battery controller software. Some prior implementations may read a pack level current and use this value for each cell. In these types of implementations, an overall bias current may be calculated. An overall bias current calculation does not compensate for differences in timing between the cell voltage measurement and the overall pack current measurement. Therefore, an implementation utilizing overall pack current and bias measurements may be less accurate. The scheme introduced allows the timing between measurements to be accommodated and improves the accuracy of the estimates as the current bias estimation is done for each cell.

The above formulation should lead to improved estimates of the battery parameters and the open-circuit voltage. Since the measurement biases are taken into account, the actual current value is represented in the model. The resulting voltage and impedance parameters may have improved accuracy since current measurement bias for each cell is accounted for in the state estimation model. The improved estimates may be used to calculate other related battery parameters or characteristics.

One application of the above model and EKF is to estimate the power capability of the battery. The first order differential equation from equations (2) and (3) can be solved using the estimated battery ECM voltage and impedance parameters of equation (13) to yield the following expression for the battery current (I).

$$I = \frac{(V_{oc} - V_t - \hat{V}_2(0)e^{-t_d/(\hat{r}_2 * \hat{C})})}{[\hat{r}_1 + \hat{r}_2(1 - e^{-t_d/(\hat{r}_2 * \hat{C})})]} \tag{32}$$

where: $t_d$ is a predetermined time value; $\hat{V}_2(0)$ is the present value of $V_2$, and e is the base of the natural logarithm.

In general, once the value for I from equation (32) is determined, the battery power capability can be found. Where it is desired to determine a charge power capability for the battery, equation (32) can be solved for a minimum value of I, such as shown in equation (33). By convention, current is defined as a positive (+) quantity when flowing away from a battery (discharge), and as a negative (−) quantity when flowing into the battery (charge).

$$I_{min}(t_d, V_{max}) = \frac{V_{oc} - V_{max} - \hat{V}_2(0)e^{-t_d/(\hat{r}_2\hat{C})}}{[\hat{r}_1 + \hat{r}_2(1 - e^{-t_d/(\hat{r}_2\hat{C})})]} \leq 0 \tag{33}$$

where: the value of ($t_d$) is predetermined, and may be for example, between 1 sec. and 10 sec., and $V_{max}$ is a maximum operating voltage for the battery, and may be considered a limiting battery voltage.

This current is then compared with a system charge current limit ($I_{lim\_ch}$). If $I_{min}(t_d, V_{max}) < I_{lim\_ch}$, a second voltage value is calculated according to equation (34), as shown below:

$$\overline{V}_{ch} = V_{oc} - \hat{V}_2(0)e^{-t_d/(\hat{r}_2\hat{C})} - I_{lim\_ch} * \left[\hat{r}_1 + \hat{r}_2\left(1 - e^{-t_d/(\hat{r}_2\hat{C})}\right)\right] \quad (34)$$

The time value ($t_d$) can be based on how battery power capabilities are used by vehicle system controller. The voltage ($V_{max}$) may be determined, for example, by a vehicle manufacturer or a battery manufacturer as the maximum voltage that the battery is allowed to reach.

The charge power capability ($P_{cap\_ch}(t_d)$) for a battery as a function of time ($t_d$) can be written in accordance with equation (35).

$$P_{cap\_ch}(t_d) = \begin{cases} |I_{min}| * V_{max} & \text{if } I_{min} \geq I_{lim\_ch} \\ |I_{lim\_ch}| * \overline{V}_{ch} & \text{Otherwise} \end{cases} \quad (35)$$

In addition to determining a charge power capability for a battery, a method for determining a discharge power capability for the battery may also be provided. For determining the discharge power capability, a maximum value of the battery current I may be used in conjunction with a minimum value of the battery voltage. Equation (32) can be used to solve for $I_{max}$ as shown in equation (36).

$$I_{max}(t_d, V_{min}) = \frac{\left(V_{oc} - V_{min} - \hat{V}_2(0)e^{-t_d/(\hat{r}_2\hat{C})}\right)}{\left[\hat{r}_1 + \hat{r}_2(1 - e^{-t_d/(\hat{r}_2\hat{C})})\right]} \quad (36)$$

where: $V_{min}$ is a minimum operating voltage of the battery pack.

This current is then compared with a system discharge current limit $I_{lim\_dch}$. If $I_{max}(t_d, V_{min}) > I_{lim\_dch}$, a second voltage value is calculated according to equation (37) as shown below:

$$\overline{V}_{dch} = V_{oc} - \hat{V}_2(0)e^{-t_d/(\hat{r}_2\hat{C})} - I_{lim\_dch} * \left[\hat{r}_1 + \hat{r}_2\left(1 - e^{-t_d/(\hat{r}_2\hat{C})}\right)\right] \quad (37)$$

The discharge power capability ($P_{cap\_dch}(t_d)$) for the battery as a function of the time ($t_d$) can be determined as shown in equation (38).

$$P_{cap\_dch}(t_d) = \begin{cases} |I_{max}| * V_{min} & \text{if } I_{max} \leq I_{lim\_dch} \\ |I_{lim\_dch}| * \overline{V}_{dch} & \text{Otherwise} \end{cases} \quad (38)$$

Equations (32)-(38) calculate power capability based on the battery ECM impedance parameters (e.g., $r_1$, $r_2$ and C) that are estimated by the EKF (equation (13)). Note that other calculation methods may be possible. The above calculation scheme is merely representative of using a battery impedance parameter estimation model to calculate battery power capability. Other calculation methods for battery power capability are possible.

The battery may then be operated based on the calculated battery power capability. That is, battery current and voltage may be maintained so as not to exceed the battery power capability. Electrical loads receiving power from or providing power to the battery may be operated such that the total power of all loads falls within the calculated battery power capability. For example, electric machines may have power limits reduced so that the battery power capability is not exceeded.

The above described equivalent circuit model may be applied to estimating the battery state of charge. One of the estimated voltage parameters may be the open-circuit voltage of the cell. The state of charge may be found by using the OCV/SOC relationship of FIG. 4 which may be expressed as a table or equivalent function within the controller.

The described system may continually calculate the measurement current bias while the traction battery is connected to electrical loads of the vehicle. There is no requirement that the contactor be open to measure and calculate the bias current. In addition, the system may compensate for a bias current that varies slowly over time.

In practice, the asynchronization bias may be a time-varying term. The above scheme treats the bias current as a nearly constant term and may not necessarily be optimal for a time-varying term. To better account for a time-varying bias current, a Distributed Faded EKF (DFEKF) may be used. The DKEKF uses forgetting factors for the various states to discount the learned values as time progresses. The above formulations and system of equations may still apply but the EKF is replaced.

The time update equations (27)-(28) may be replaced by equations (39)-(40) as follows:

$$\hat{x}_k^- = f(\hat{x}_{k-1}, u_{k-1}) \quad (39)$$

$$P_k^- = A_k\Lambda_k P_{k-1}\Lambda_k^T A_k^T + \Lambda_k Q_{k-1}\Lambda_k^T \quad (40)$$

The measurement update equations (29)-(31) may be replaced by equations (41)-(43) as follows:

$$K_k = P_k^- H_k^T (H_k P_k^- H_k^T + R_k)^{-1} \quad (41)$$

$$\hat{x}_k = \hat{x}_k^- + K_k(z_k - h(\hat{x}_k^-)) \quad (42)$$

$$P_k = (I - K_k H_k)P_k^- \quad (43)$$

A discounting factor the state variable $x_6$ representing the current measurement bias term may be formulated. The forgetting factor matrix may be designed as:

$$\Lambda_k = \begin{bmatrix} 1 & 0 & 0 & 0 & 0 & 0 \\ 0 & 1 & 0 & 0 & 0 & 0 \\ 0 & 0 & 1 & 0 & 0 & 0 \\ 0 & 0 & 0 & 1 & 0 & 0 \\ 0 & 0 & 0 & 0 & 1 & 0 \\ 0 & 0 & 0 & 0 & 0 & \alpha \end{bmatrix} \quad (44)$$

where $\alpha$ may be a calibrated value, and may be set to a value less than one, for example. Over time, the bias current estimate may be allowed to adjust to the time-varying value.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle comprising:
a traction battery including a plurality of cells; and
at least one controller programmed to implement a state estimator configured to estimate, for each cell, a current measurement bias specific to the cell that depends on a temporal difference between current and voltage measurements for the cell, and operate the traction battery according to a state of charge derived from voltage parameters that are based on the current measurement bias.

2. The vehicle of claim 1 wherein the at least one controller is further programmed to control the traction battery according to battery power limits defined by output of the state estimator.

3. The vehicle of claim 1 wherein at least some of the current measurement biases have different values.

4. The vehicle of claim 1 wherein the voltage parameters include an open circuit voltage for the cell.

5. The vehicle of claim1 wherein the state estimator is further configured to output, for each cell, impedance parameters based on the current measurement bias specific to the cell.

6. The vehicle of claim 5 wherein the impedance parameters include a resistance associated with the cell.

7. The vehicle of claim 1 wherein the state estimator is further configured to apply a forgetting factor to the current measurement bias.

* * * * *